United States Patent [19]

Bojarski

[11] 4,160,206

[45] Jul. 3, 1979

[54] AUDIBLE VOLTAGE-IMPEDANCE TESTER

[75] Inventor: Victor Bojarski, Bridgeport, Conn.

[73] Assignee: Bengt Berendonk, Whittier, Calif.

[21] Appl. No.: 860,598

[22] Filed: Dec. 14, 1977

[51] Int. Cl.² .................... G01R 15/12; G01R 19/16; G01R 27/00; G01R 31/02
[52] U.S. Cl. ................................. 324/73 R; 324/51; 324/62; 324/133
[58] Field of Search ...................... 324/51, 72.5, 73 R, 324/133, 149, 62

[56] References Cited

U.S. PATENT DOCUMENTS

| 3,529,237 | 9/1970 | Kilchhofer | 324/51 |
| 3,872,384 | 3/1975 | Laass | 324/133 X |
| 3,911,360 | 10/1975 | Kimzey | 324/133 |
| 3,962,630 | 6/1976 | Chaffee | 324/51 |
| 4,015,201 | 3/1977 | Chaffee | 324/51 |

OTHER PUBLICATIONS

Loiselle, J. T., Low-Voltage and Current Continuity Tester, IBM Tech. Discl. Bull., vol. 12, No. 7, Dec. 1969, p. 926.

Primary Examiner—Gerard R. Strecker
Attorney, Agent, or Firm—Mattern, Ware, Davis & Stoltz

[57] ABSTRACT

An audible voltage-impedance tester for generating distinct sounds when its test probes are connected across an unknown source, be it a resistive source, a DC voltage source, an AC voltage source or combination thereof. No switching is required between resistive testing and voltage testing nor between DC voltage testing and AC voltage testing. The tester is able to generate distinct sounds for different resistance values, for different DC voltage amplitudes, for different AC voltages with the same frequency but different amplitudes, and for AC voltages with different frequencies but the same amplitudes.

A visual indicator of the audible sound is disclosed along with circuitry that utilizes a multi-vibrator whose powered operation by a battery is not affected by the unknown source.

25 Claims, 9 Drawing Figures

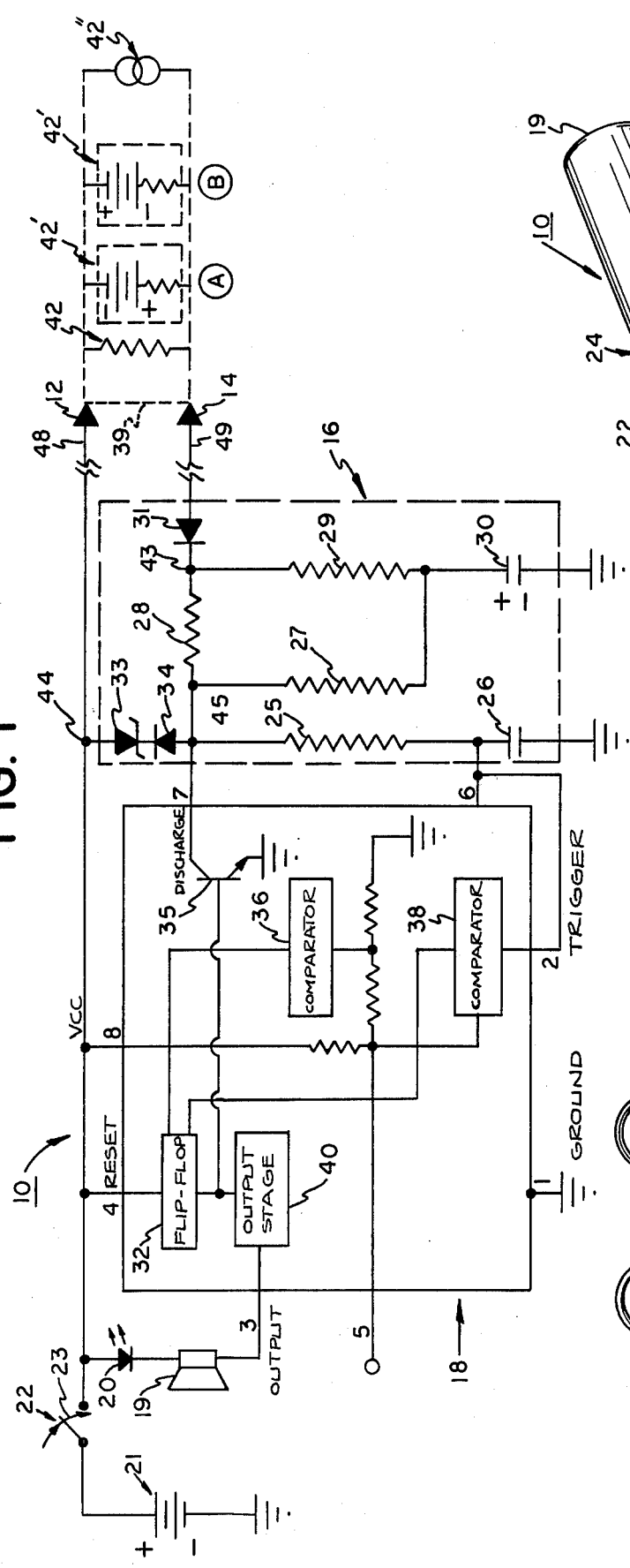

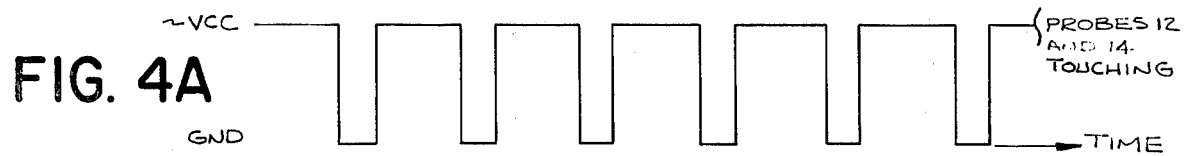
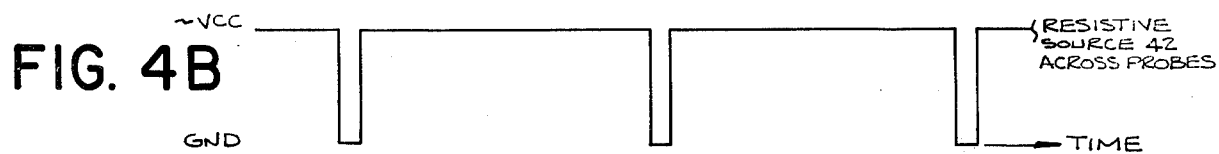
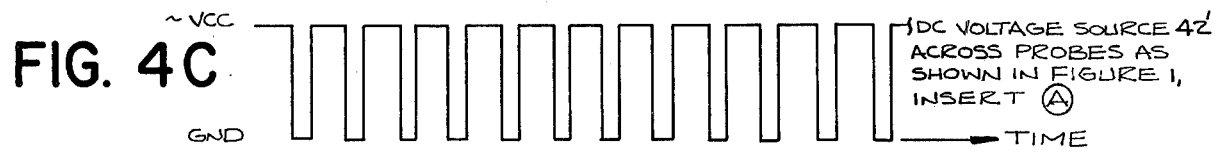
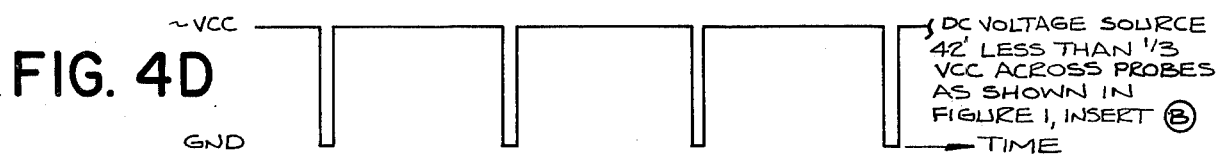
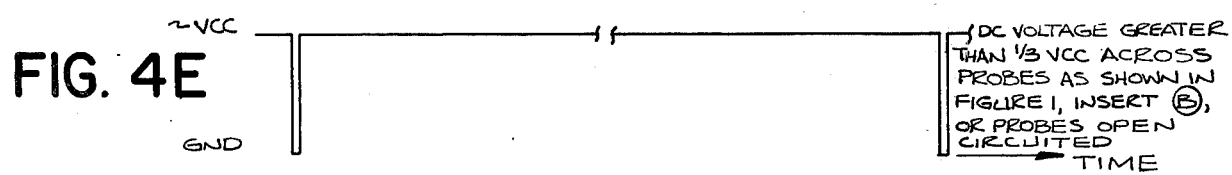
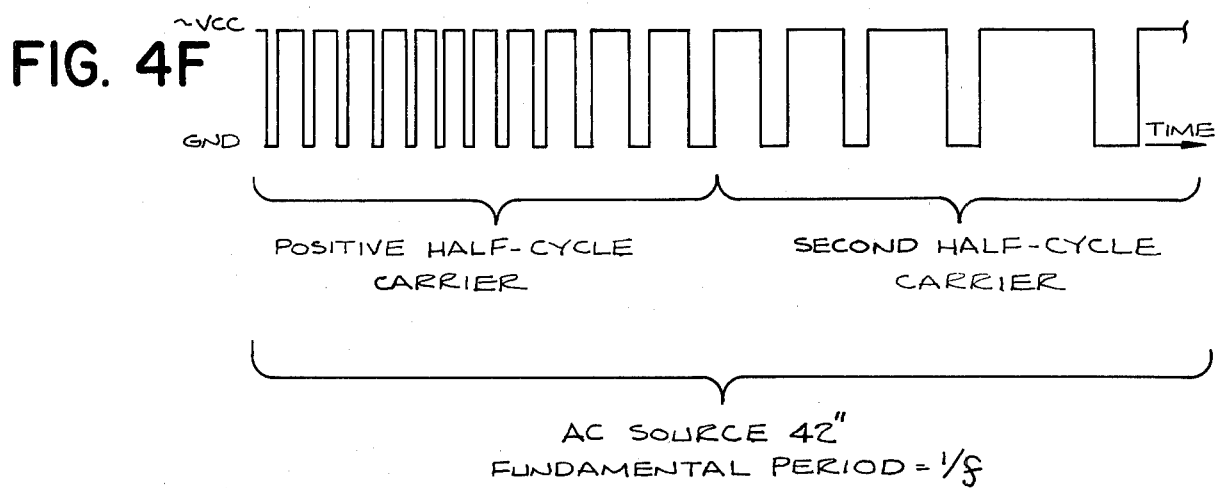

AUDIBLE VOLTAGE-IMPEDANCE TESTER

BACKGROUND OF THE INVENTION

1. Field of the Invention

The present invention relates to voltage and resistance testers and, in particular, to such testers that generate an audible signal representative of the unknown voltage or resistance.

2. Description of the Prior Art

A listing of all the prior art known to the Applicant is set forth in a Prior Art Statement. In brief, although the prior art discloses devices which can generated audible signals in response to an external resistance or voltage, it has generally been necessary that the device be switched from measuring resistances to measuring voltages and vice versa. In addition, none of the prior art discloses or suggests generating an audible sound in response to an unknown alternating current voltage which is indicative not only of its frequency but also of its amplitude. Furthermore, none of the prior art known to the Applicant discloses or suggests an audible voltage-resistance tester which utilizes an inexpensive integrated circuit timer, interconnected to the remaining circuit components of the tester to operate as a multi-vibrator for providing the output signal to a speaker.

SUMMARY OF THE INVENTION

An audible voltage-resistance tester according to the present invention comprises an integrated circuit timer interconnected with the remaining circuit components so as to operate as a multi-vibrator whose instantaneous frequency is dependent upon the resistance or voltage of an interconnected source. The source is interconnected to the tester by a pair of probes which in turn interconnect to an input module that transforms the unknown resistance or voltage source into a form directly usable by the multi-vibrator so as to generate an output frequency by the multi-vibrator indicative of the resistance of the unknown source, its DC or AC voltage, or a combination of these parameters. The source connected across the probes is placed in series with a battery and an input module. The input module includes a first network that generates a current proportional to the average DC half-wave rectified voltage of the source if the source includes an AC voltage component, this current being combined with a current proportional to the source's instantaneous voltage. This combined current is interconnected to a second network comprising a resistor and capacitor so as to charge the capacitor at a rate proportional to the magnitude of the combined current. The multi-vibrator is connected across the capacitor and resistor of the second network so as to change state at a rate dependent upon the capacitor charging and discharging between two voltages equal to different fractional values of the battery voltage. The capacitor is discharged through its associated resistor in combination with a discharge transistor within the multi-vibrator.

The input module further incorporates over voltage protection circuitry to maintain all voltages sensed by the multi-vibrator at a level less than its maximum rated voltage. This over-voltage protection circuitry further provides a small leakage current path from the battery to the second network so as to cause the multi-vibrator to change state periodically, thereby informing the user the tester is energized.

The output of the multi-vibrator is interconnected to a speaker for generating the audible sounds. A light emitting diode (LED) may also be connected in series with the speaker for minimizing the power dissipation of the speaker and also for giving a visual indication of the multi-vibrator's output signal.

OBJECTS OF THE INVENTION

Therefore, it is a principal object of the present invention to provide an audible voltage-impedance tester capable of distinguishing between resistance, direct current voltage, and alternating current voltage without switching;

Another object of the present invention is to provide an audible voltage-impedance tester of the above character capable of distinguishing between alternating current voltage sources having the same frequency but different amplitudes as well as alternating current voltage sources having the same amplitude but different frequencies;

Another object of the present invention is to provide an audible voltage-impedance tester of the above character utilizing an integrated circuit timer connected to the remaining circuit components of the tester so as to operate as a multi-vibrator powered by a constant voltage power source and switching between states dependent upon the charging and discharging of a capacitor respectively between a first voltage equal to a first fractional value of the constant voltage source and a second voltage equal to a second fractional value of the constant voltage source, the second fractional value being less than the first fractional value;

A still further object of the present invention is to provide an audible voltage-impedance tester of the above character which is inexpensive to manufacture yet has a rugged construction;

Another object of the present invention is to provide an audible voltage-impedance tester of the above character having over-voltage protection circuitry so as to prevent an unknown voltage source from harming the electronic components of the tester;

A still further object of the present invention is to provide an audible voltage-impedance tester of the above character capable of including a light emitting diode in series with a speaker so as to give a visual indication of the output of the tester;

Another object of the present invention is to provide an audible voltage-impedance tester of the above character which is able to generate periodic short interval sounds when the unit is energized even though the probes are not connected to a source;

Other objects of the present invention will in part be obvious and will in part appear hereinafter.

THE DRAWINGS

For a fuller understanding of the nature and objects of the present invention, reference should be had to the following detailed description taken in conjunction with the accompanying drawings, in which:

FIG. 1 is an overall schematic diagram of the audible voltage-impedance tester according to the present invention including a block diagram of the internal configuration of the integrated circuit utilized, and illustrating the interconnection of various resistance and voltage unknown sources to the tester;

FIG. 2 is a perspective view of a preferred type of mechanical case that may be utilized with the present invention;

FIG. 3 is a perspective view of another type of case that may be utilized with the present invention;

FIG. 4A is a voltage waveform across the speaker of the present invention when the tester is sensing zero ohms;

FIG. 4B is a typical voltage waveform across the speaker when the tester senses a resistance;

FIG. 4C is a typical waveform across the speaker when a DC voltage source aiding the battery voltage of the tester is sensed;

FIG. 4D is a typical waveform across the speaker when a DC voltage source less than one-third the battery voltage is sensed so as to buck the battery voltage;

FIG. 4E is a waveform across the speaker when the probes of the tester are open-circuited or when a DC voltage source greater than one-third the battery voltage is placed across the probes so as to buck the battery voltage; and FIG. 4F is a typical waveform across the speaker when an AC source is sensed by the tester.

DETAILED DESCRIPTION

As best seen in FIG. 1, an audible voltage-impedance tester 10 comprises a pair of probes 12 and 14, an input module 16, a multi-vibrator 18, an electroacoustic transducer 19 such as a speaker, an optional light emitting diode 20, a battery 21, and a switch 22. The circuit components for the elements shown in FIG. 1 are set forth in Table 1. These circuit components may be housed in a case 24 as shown in FIG. 2 or FIG. 3. Other methods for housing the circuit components would of course be obvious to one of ordinary skill in the art.

The audible voltage-impedance tester 10 according to the present invention is able to measure resistances from zero ohm to one megohm, DC voltages from 0.15 volts to 40 volts, and AC voltages from 0.15 VRMS to 250 VRMS. No range switching is necessary for measuring any of these three parameters nor is switching necessary between any of these three parameters. The tester generates a unique distinguishable sound for these resistance and voltage ranges which are readily identifiable by the user. The tester is especially useful in utility and telephone repair applications due to its rugged construction and ease of use not requiring one to remove his or her eyes from the interconnected unknown source.

In operation, switch 22 is closed as shown by arrow 23 allowing battery 21 to energize integrated circuit 18, via pin 8 probe 12, and input module 16.

TABLE 1

| Element No. | Description |
|---|---|
| 12 | Probe Tip, Negative ("Black") |
| 14 | Probe Tip, Positive ("Red") |
| 18 | Oscillator "Timer No. NE 555N, Signetics, P.O. Box 5052 811 East Arques Avenue Sunnyvale, CA. 94086 |
| 19 | Speaker |
| 20 | Light Emitting Diode (LED) |
| 21 | Battery 9 volt (Constant voltage power source) |
| 22 | Switch |
| 25 | Resistor, 10K ¼ Watt, 10% Tolerance |
| 26 | Capacitor, .05 microfarad, 50 VDC |
| 27 | Resistor, 22 K, ¼ W, 10% Carbon |
| 28 | Resistor, 22 K Ohm, 1 Watt 10% Tolerance |
| 29 | Resistor, 100 K, ¼ W. 10% Tolerance |
| 30 | Capacitor, 10 microfarad, 50 VDC (aluminum electrolytic) |
| 31 | Diode, IN4007, 1 Amp, 1000 PIV |
| 33 | Zener diode, IN4744, 15 Volt, 1 Watt |

TABLE 1-continued

| Element No. | Description |
|---|---|
| 34 | Diode, IN4007, 1 Amp, 1000 PIV |

Input module 16 comprises a half-wave rectified DC voltage averaging network comprising resistors, 27, 28 and 29, capacitor 30, and diode 31, a resistor-capacitor charging and discharging network comprising resistor 25 and capacitor 26, and an over-voltage protection circuit comprising zener diode 33 and diode 34.

When probes 12 and 14 are touched together as shown by dotted line 39, the multi-vibrator will oscillate at a fixed "reference" frequency. Since the voltage of battery 21 is in reverse bias to diode 34, the over-voltage protection circuit comprising zener diode 33 and diode 34 are effectively out of the circuit. Conversely, since diode 31 is forward biased, it is effectively a short circuit leaving resistors 25, 27, 28 and 29 and capacitors 26 and 30 as the remaining circuit elements interconnected to the integrated circuit 18.

Initially, both capacitors 30 and 26 will begin to charge at a rate dependent upon their respective capacitance and the effective resistance in series therewith. However, when the probes are touching each other, the charging of capacitor 30 is relatively unimportant with respect to the oscillator reference frequency as discussed below.

Initially, the internal flip-flop 32 of integrated circuit 18 is forced in the RESET state by battery 21 via RESET pin 4. With flip-flop 32 in the RESET state, DISCHARGE transistor 35 is in the OFF or open circuit state. External capacitor 26 then charges through resistor 25 and the parallel combination of resistor 28 with the series combination of resistors 27 and 29, until the THRESHOLD comparator 36 detects at pin 6 a voltage approximately equal to two-thirds VCC, that is, two-thirds of the voltage of battery 21. Using a 9-volt battery, this voltage is six volts. At this time, the THRESHOLD comparator 36 switches and SETS the flip-flop 32 which then biases the DISCHARGE transistor 35 into the ON or conducting state. With transistor 35 in the ON state, external capacitor 26 is discharge through resistor 25 via pin 7 connected to transistor 35. When the capacitor voltage falls to approximately one-third the VCC voltage, the TRIGGER comparator 38 connected to capacitor 26 at pin 2 is switched so as to RESET flip-flop 32 which then turns OFF DISCHARGE transistor 35. The cycle is then repeated. For the circuit components set forth in Table 1, the above repetition occurs at a rate of approximately 600 hertz when the probes touch each other. The rate is called the "reference" frequency of the tester and is used as a datum to compare other signals generated in response to connection of the probes to an unknown source. That is, it is this reference frequency which is altered depending upon the resistance or voltage of the external source across probes 12 and 14 that is audibly detectable by the user so as to identify the unknown source. This audible detection occurs by output stage 40 of multi-vibrator 18 providing a buffered output of up to approximately 200 milliamperes corresponding to the state of transistor 35 so as to drive speaker 19 (current flow depending on the impedance of the speaker). The waveform for this reference frequency across speaker 19 is shown in FIG. 4A. Light emitting diode (LED) 20 is also driven by this output signal generated by multivibrator 18. The LED also slightly reduces the power consumption of speaker 19 by presenting a voltage drop in series with the speaker and battery effectively reducing the current flow through speaker 19 when output stage 40 is near ground. As shown in FIG. 1, the operation of tester 10 when an unknown resistance source 42 is connected across probes 12 and 14 is similar to that where probes 12 and 14 touch each other. Indeed when resistor 42 equals zero ohms, the circuit reverts to the same configuration as when probes 12 and 14 touch each other and will therefore oscillate at the same reference frequency. As resistance 42 begins to increase, the current charging capacitor 26 will decrease and therefore, the time needed to charge this capacitor to the THRESHOLD value will correspondingly increase. Since the output frequency of pin 3 of integrated circuit 18 is inversely proportional to the charging time of capacitor 26, the output frequency will therefore decrease as resistance 42 increases. The waveform across speaker 19 for a typical resitance across probes 12 and 14 is shown in FIG. 4B. Since the unknown resistance source 42 and the integrated circuit 18 are connected to the same supply voltage, namely battery 21, and since the switching of the multi-vibrator 18 is dependent on the ratio of the voltage at pins 6 and 2 with respect to the supply voltage, the oscillator frequency is independent of supply voltage, unlike the prior art.

The operation of the tester when an unknown DC voltage source 42' is connected across probes 12 and 14 is also shown in phantom in FIG. 1 for both aiding battery 21 (insert A) and bucking battery 21 (insert B). This voltage source is shown in FIG. 1 with its Thevenin equivalent; that is, as a pure DC voltage in series with a resistance equal to the source's input resistance. When the unknown voltage source is connected to aid the voltage of battery 21, diode 31 is forward biased and effectively acts as a short circuit passing current to node 43. Since the voltage across resistor 25 and capacitor 26 is greater than that otherwise present if probes 12 and 14 merely touched each other and were supplied current only by the battery, the time necessary for capacitor 26 to reach two-thirds VCC is correspondingly reduced thereby causing the output frequency of multi-vibrator 18 to correspondingly increase. That is, the charging rate of capacitor 26 is a function of both the battery 21 and the unknown voltage source 42' aiding the battery. The waveform for a typical DC voltage source aiding battery 21 is shown in FIG. 4C. This increase in the multi-vibrator frequency occurs in the present configuration because the THRESHOLD comparison level of multi-vibrator 18 is independent of the unknown voltage source and remains a function solely of the battery voltage.

In order to maintain over voltage protection for multi-vibrator 18, zener diode 33 in conjunction with diode 34 clamp the effective voltage across nodes 44 and 45 at approximately fifteen volts. This clamping occurs when the voltage of source 42' connected to probes 12 and 14 as shown in insert A reaches a value of approximately 40 volts. Diode 34 also prevents battery current for directly driving node 45 through zener diode 44, which would otherwise render proper operation of the tester impossible. When probes 12 and 14 are open circuited, zener diode 32 and diode 34 pass a small leakage current to node 45 which causes capacitor 26 to slowly charge to the two-thirds VCC value, causing multivibrator 18 to change state. For the component values set forth in Table 1, this change of state occurs about every thirty seconds. This is heard at speaker 19 as a "click" and at LED 20 as a short flash, and thus indicates to the user that switch 22 is closed. The waveform across speaker 19 is shown in FIG. 4E.

Diode 31 is utilized to provide polarity sensing when an unknown DC voltage source is connected across probes 12 and 14, prohibiting current flow when the unknown voltage source 42' has its polarity as shown in insert B and a voltage greater than approximately ⅓ VCC (discussed below). In this configuration, capacitor 26 is unable to charge up to a value of two-thirds the voltage of battery 21 (⅔ VCC), except for leakage current through a zener diode 33 and diode 34; thereby effectively preventing multi-vibrator 18 from operating. In this configuration, the audible tester only generates the periodic thirty second "click" and thus indicates to the user that a DC voltage is present across probes 12 and 14 having a polarity bucking that of battery 21. The waveform across the speaker is shown in FIG. 4E.

It should be noted that if the voltage of the voltage source 42' is less than one-third the voltage of battery 21, the capacitor 26 will in time obtain a value of ⅔ VCC thereby causing the multi-vibrator to operate. As the voltage of the unknown voltage source is decreased from one-third battery voltage to zero percent battery voltage, the audible frequency will increase from zero cycles (except for the thirty second "click") to the reference frequency (assuming the internal impedance of voltage source 42' is very small in comparison to the resistance of resistor 25). The waveform across the speaker for this configuration is shown in FIG. 4D. If the internal resistance of the unknown voltage source when at zero volts is more than an insignificant fraction of the effective resistance in series with capacitor 26, the frequency of the speaker 19 will be somewhat less than the normal reference frequency when probes 12 and 14 are touched together, representing in essence the resistance of the unknown voltage source.

FIG. 1 also illustrates operation of the tester when probes 12 and 14 are connected to an alternating current voltage source 42". This operation is similar to that for the previously described DC operation. In addition, diode 31 in combination with resistors 27, 28 and 29 and capacitor 30 provide for the storage of current during the positive half cycles of voltage impressed upon them when diode 31 is forward biased by voltage source 42". This charging of capacitor 30 thus is proportional to the half-wave rectified voltage amplitude of AC source 42". This charge on capacitor 30 impresses a current at node 45. During positive half-wave cycles of voltage source 42", the above current is added to the current generated by voltage source 42" in combination with battery 21. Both these currents are impressed upon resistor 25 and capacitor 26 to charge capacitor 26 at a rate greater than the reference rate. During the negative half cycles of source 42" (when the unknown source opposes the battery voltage), instead of the oscillator being prevented from oscillating, which would otherwise occur if capacitor 30 and associated resistors 27, 28 and 29 were not present, a current is transferred to node 45 from capacitor 30 which charges capacitor 26 at a rate less than during the positive half cycle of source 42". As shown in FIG. 4F, the tone generated at the speaker 19 has two operation phases, one during the positive half cycle of the source (diode 31 forward biased) and another during the negative half cycle of the source (diode 31 back biased). As shown in FIG. 4F during the positive half cycles a fairly constant frequency oscillation is obtained while during the negative half cycles, a transitional decrease in the oscillation frequency occurs as capacitor 30 discharges. For the preferred embodiment of the present invention disclosed herein having a reference frequency of approximately 600 hertz, fundamental frequency components for the unknown AC source up to approximately 100 hertz are easily detectable. The RC time constant of resistor 25 and capacitor 62 is approximately one-tenth the half cycle period of a 100 hertz source. For AC sources having a fundamental frequency greater than 100 hertz, the fundamental frequency of the unknown voltage source is no longer clearly predominants at speaker 19. Instead harmonics of the fundamental frequency are generated, along with beat frequencies if the AC source frequency is close to the reference frequency are generated. These sounds can easily be interpreted by the user as representing a relatively high frequency AC voltage source. By capacitor 30 storing a charge proportional to the half-wave rectified amplitude of the voltage source, the current flow to node 45 and ultimately to capacitor 26 is a function of the amplitude of the unknown voltage source. That is, the higher the source's amplitude, the faster capacitor 26 charges, resulting in higher carrier frequency components generated during each half cycle of the AC voltage source at speaker 19. For the positive half cycles, this result occurs until zener diode 33 enters its breakdown stage, at which time additional current flow to node 45 from capacitor 30 is passed through the zener diode so as not to increase the charging rate of capacitor 26. This charging of capacitor 30 by the voltage source continues to occur and be a function of the voltage source amplitude even if the zener diode clamping circuit is activated. However the current flow to node 45 from capacitor 30 is then only passed to resistor 25 and capacitor 26 when diode 34 is reversed biased; that is, during the negative half cycles of source 42". Nevertheless, the output waveform across transducer 19 is still as shown in FIG. 4F. Thus, the tester is able to distinguish unknown AC input voltages having the same frequency buty varying in amplitude, even if this amplitude is greater than the typical 40 volts at which the clamping circuitry becomes operative. Indeed, the present tester is able to detect and distinguish AC sources up to 250 VRMS at which point capacitor 30 becomes nearly charged to its maximum rated voltage. Thus for AC sources the tester generates a sound indicative not only of the source's frequency but also of the source's amplitude.

If the unknown AC source placed across probes 12 and 14 has a DC component with a voltage aiding polarity (Insert A), such as found on telephone lines, the tester will generate the same type of output signal as shown in FIG. 4F, except that the carrier frequencies during the half-cycle will be increased by the DC component. Reversing the test probes across the composite DC, AC source will cause a reduction of the carrier frequencies heard at speaker 19.

Thus, the present invention is an audible volt-ohm tester having automatic range switching and function switching. In normal operation, the user first touches probes 12 and 14 together to hear the reference frequency of the tester. Then if the user wishes to test for an unknown resistance, he or she places the resistance across probes 12 and 14. The decrease in the speaker frequency with respect to the reference frequency inversely indicates the increase resistance of the source up to approximately one megaohm; at which time, the frequency at the speaker will drop to approximately one to two cycles per second. These cycles are normally heard as "clicks" since the multi-vibrator has a sharp transistion from ON to OFF, and vice versa. If the unknown source is a voltage source to zero volts, the frequency will be approximately equal to the reference frequency, reduced by the internal resistance of the voltage source. As the voltage of the voltage source increases to 40 volts, the tone generated will increase in frequency. At 40 volts the clamping circuitry becomes effective, preventing further audible change.

For measuring AC voltages up to about one-sixth the reference frequency, the speaker frequency will have a fundamental component equal to the fundamental frequency of the AC source with two carrier frequencies during the two half-cycles of the source, the first being a fairly constant frequency during the positive half-cycle of the source, and the second being a transitional frequency during the negative half-cycle of the source.

The tester can also be used to detect the presence of combined AC and DC signals such as those found in telephone networks and may be used in tracing logic levels in digital networks. Furthermore, the present tester can be utilized to test electrolytic capacitors by first connecting probe 14 to the positive side of the capacitor and probe 12 to the other side, and noting how the tone at the speaker changes from the reference frequency to zero as the capacitor charges. When the probes are reversed across the electrolytic capacitor, the tone at the speaker will start at a frequency higher than the reference frequency and then decrease.

Furthermore, diodes may be tested by placing the probes across the diode to see if only a very low frequency is generated at the speaker (indicating that the diode is blocking battery 21) and then reversing the probes, at which time the tone at speaker 19 should be approximately equal to the reference frequency. In a similar manner, transistors can be tested across each of their base, emitter and collector junctions.

As best seen in FIG. 2, the electronic components comprising the circuitry shown in FIG. 1 may be placed in a case 24 with leads 48 and 49 emanating therefrom terminating at probes 12 and 14 respectively. Alternatively, a case such as that shown in FIG. 3 may be utilized with test probe 12 emanating from one end of the case and test lead 49 emanating from another location. Alternatively, test probe 14 could emanate from one end of the case with test lead 48 emanating from the other location. This particular case is useful in applications where circuit components to be tested are spaced closely together.

Thus, what has been described is a low cost audible voltage-impedance tester capable of generating distinct audible sound for measuring resistance, DC voltages, AC voltages, or combinations of resistance, DC voltages, or AC voltages, including superimposed DC and AC voltages at one source. The audible tester is capable of measuring resistances from 0 ohms to 1 megohms, D.C. voltages from 0.15 volts to 40 volts, and AC voltages from 0.15 VRMS to 250 VRMS. When measuring AC voltages, the audible tester is capable of distinguishing AC sources having the same frequency but different amplitudes as well as distinguishing AC sources with the same voltage but different frequencies. In addition, the audible tester according to the present invention has automatic voltage and resistance switching. The tester may further be used as a continuity tester since the probe currents are in the order of hundreds of microamperes. Furthermore, the audible tester is able to distinguish the polarity of D.C. voltage sources. Due to the choice of circuit components utilized, the audible tester is relatively temperature insensitive. Furthermore, cases such as those shown in FIGS. 2 and 3 provide a small, impact-resistant housing which facilitates use of the audible tester.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed is:

1. An audible voltage-impedance tester comprising:
   (A) first and second test probes for connecting to an unknown voltage or impedance source;
   (B) an input module electrically connected to the second test probe, comprising:
      (1) a first network for at least partially rectifying an alternating current input from the unknown source, if the source includes an alternating current voltage, the network including a capacitor for storing at least a portion of this rectified current so as to discharge this charge as a first current proportional to the alternating current-amplitude of the unknown source to a first node of the network, the network further comprising means for generating a second current proportional to the instantaneous current passing through the unknown source, the second current combining with the first current at the first node to yield a first network output current;
      (2) a second network comprising at least a resistor and capacitor in series and interconnected to the first node of the first network for charging the capacitor of the second network at a rate proportional to the network output current from the first network;
   (C) an oscillator interconnected to the second network and having an oscillating output signal frequency proportional to the charging rate of the capacitor of the second network;
   (D) an electroacoustic transducer connected at one end to the output of the oscillator for generating an audible signal responsive to the oscillator output signal;
   (E) a constant voltage source of electrical power; and
   (F) means for interconnecting the other end of the electroacoustic transducer, the oscillator and first probe to the source of constant voltage electrical power for powering the same;
whereby the oscillator generates a zero voltage reference output signal, causing a corresponding audible sound to be generated by the transducer when the first and second probes are electrically contacted to each other, and whereby the oscillator generates distinct output signals causing corresponding audible sounds to be generated by the transducer when the first and second probes are connected across resistive unknown sources, DC voltage unknown sources, AC voltage unknown sources, or combinations thereof, so that each unknown source is distinguishable by a distinct sound.

2. An audible voltage-impedance tester as defined in claim 1, wherein the input module further comprises means for protecting the interconnected oscillator means from voltages of the unknown source in excess of the oscillator's rated maximum voltage.

3. An audible voltage-impedance tester as defined in claim 2, wherein the over-voltage protection means comprises a zener diode with its anode electrically connected to the first probe and a second diode having its cathode connected to the cathode of the zener diode and its anode electrically connected to the first node of the first network, the second diode inhibiting current flow through the zener diode from the source of constant voltage electrical power while allowing the zener diode to enter its constant voltage breakdown state if the unknown voltage source as sensed by the zener diode exceeds the zener diode's breakdown voltage point.

4. An audible voltage-impedance tester as defined in claim 3 wherein the over-voltage protection means passes a leakage current from the source of constant voltage electrical power to the first node of the first network so as to slowly charge the capacitor of the second network when the first and second probes are open-circuited, whereby the oscillator output means is periodically activated by the second network so as to inform the user that the tester is energized.

5. An audible voltage-impedance tester as defined in claim 1 further comprising:
   (G) a light-emitting diode in series with the electroacoustic transducer for visually indicating the oscillator signal activating the transducer as well as to reduce the current flow through the transducer and thus reduce the power requirements of the constant voltage power source.

6. An audible voltage-impedance tester as defined in claim 1, wherein the first network comprises a diode having its anode interconnected to the second test probe, a first resistor and a second resistor connected together at one end to the cathode of the diode, a third resistor connected at the other end of the first resistor and connected at its other end to the other end of the second resistor, the capacitor of the first network connected to the junction of the second and third resistors, the junction of the first and third resistors forming the first output current node of the first network.

7. An audible voltage-impedance tester as defined in claim 6, wherein the oscillator means comprises an integrated circuit timer connected to operate as a multivibrator having a discharge output, a threshold output, a trigger, and an output stage output, wherein the threshold output and trigger output are interconnected to the junction of the resistor and capacitor of the second network, the discharge output is connected to the other side of the resistor of the second network and the electroacoustic transducer is connected to the output stage output, wherein the operating frequency of the oscillator is dependent upon the time period necessary for the capacitor of the second network to charge to approximately two-thirds the constant voltage power source output voltage and to discharge to one-third of this power source output voltage.

8. An audible voltage-impedance tester as defined in claim 7, wherein the input module further comprises over voltage protection means for protecting the interconnected oscillator means from voltages of the unknown source in excess of the oscillator's rated maximum voltage.

9. An audible voltage-impedance tester as defined in claim 8, wherein the constant voltage source of electrical power is a battery, wherein the means for interconnecting the electroacoustic transducer, oscillator means and first probe to the battery is a switch, and wherein the electroacoustic transducer is a speaker.

10. An audible voltage-impedance tester as defined in claim 1, wherein the electroacoustic transducer is a speaker, wherein the constant voltage source of electrical power is a battery, and wherein the means for interconnecting the transducer, oscillator means, and first probe to the source of constant voltage power is a switch.

11. An audible voltage-impedance tester as defined in claim 10, further comprises:
(G) a hand-holdable case for housing the input module, oscillator means, speaker, battery and switch.

12. An audible voltage-impedance tester as defined in claim 11, wherein the case has a rectangular cross-section and wherein the tester incorporates a pair of leads respectively connected from the first and second probes of the switch and input module.

13. An audible voltage-impedance tester as defined in claim 11, wherein the case is substantially of a cylindrical cross-sectional shape with one of the two probes emanating from one of the end terminations of the case, and wherein the tester comprises a lead connected to the other probe at one end and the input module or switch at its other end.

14. An audible voltage-impedance tester as defined in claim 1, wherein the resistor and capacitor of the second network of the input module has a time constant approximately one-tenth the half cycle period of the highest frequency unknown source to be sensed by the tester for sources including an AC component, so that the oscillator means generates a first output signal causing a corresponding audible sound to be generated by the transducer during one half cycle of the unknown source and a second output signal causing a corresponding audible sound to be generated by the transducer distinct from the first output signal and sound generated therefrom during the other half cycle of the unknown source, whereby the fundamental frequency of the unknown source is clearly heard due to the change in sound generated by the transducer during each half cycle of the unknown source.

15. An audible voltage-impedance tester comprising:
(A) a battery with a constant voltage and with a reference terminal;
(B) means for removably contacting across an unknown voltage or impedance source, said means having first and second probes, the first probe switchably interconnected to the battery;
(C) input means interconnected to at least the second probe of the unknown source contacting means and to the reference terminal of the battery and including a resistor and a capacitor serially connected to each other for electrically sensing the current passing through the unknown source;
(D) a multi-vibrator interconnected to the resistor and capacitor and powered by the battery, the multi-vibrator having an output with a signal generated thereon that changes state when the capacitor of the input means charges and discharges between two voltage states, the first state being a first fraction of the battery voltage and the second state being a second, smaller, fraction of the battery voltage; and
(E) an electroacoustic transducer connected to the output of the multi-vibrator for generating a sound representative of the output signal of the multi-vibrator;
whereby the audible tester senses resistances or voltages without coupling the unknown source to the battery in a manner so as to be in series with the multivibrator, but connects the unknown source to the battery so as to influence the charge and discharge rate of the resistor-capacitor network of the input module, thereby generating a distinct output by the multi-vibrator which drives the electroacoustic transducer.

16. An audible voltage-impedance tester as defined in claim 15, wherein the multi-vibrator comprises an integrated circuit timer interconnected to operate as a multi-vibrator controlled by the charge and discharge voltage of the capacitor of the input module.

17. An audible voltage-impedance tester as defined in claim 16, wherein the input module further comprises means for protecting the multi-vibrator and the components of the input module from voltages in excess of their rated voltages.

18. An audible voltage-impedance tester as defined in claim 17, wherein the over-voltage protection means of the input module comprises a zener diode having its anode connected to the first probe and a second diode having its cathode connected to the cathode of the zener diode and anode connected to the resistor of the resistor-capacitor network of the input module.

19. An audible voltage-impedance tester as defined in claim 15, further comprising:
(F) a light-emitting diode connected in series with the electroacoustic transducer so as to visually indicate the multi-vibrator output signal as well as to limit the current flow through the transducer.

20. An audible voltage-impedance tester as defined in claim 19, wherein the input module further comprises at least a partial rectifying direct current storage network electrically connected to the second probe and having a current flow proportional to the average partially rectified direct current value of the unknown source, said output connected to the resistor of the resistor-capacitor charging network, whereby the multi-vibrator generates at least a component frequency proportional to the partially rectified direct current value of the unknown source.

21. An audible voltage-impedance tester as defined in claim 20, wherein the resistor and capacitor of the input module has a time constant approximately one-tenth the half cycle period of the highest frequency unknown source to be sensed by the tester if the source includes an AC component, so that the multi-vibrator generates a first frequency output signal during one half cycle of the unknown source and a second output signal distinct from the first output signal during the second half cycle of the unknown source, whereby the fundamental frequency of the unknown source is clearly heard due to the change in frequency of the transducer during each half cycle of the unknown source.

22. An audible voltage-impedance tester as defined in claim 15, wherein the resistor and capacitor of the input module has a time constant approximately one-tenth the half cycle period of the highest frequency unknown source to be sensed by the tester if the source includes an AC component, so that the multi-vibrator generates a first frequency output signal during one half cycle of the unknown source and a second frequency output signal distinct from the first output signal during the second half cycle of the unknown source, whereby the fundamental frequency of the unknown source is clearly heard due to the change in frequency of the transducer during each half cycle of the unknown source.

23. An audible voltage-impedance tester as defined in claim 15, further comprising:

(F) a hand-holdable case for housing the input module, output oscillator means, speaker, battery and switch.

24. An audible voltage-impedance tester as defined in claim 23, wherein the means for removably contacting across an unknown source includes a pair of leads respectively connected to the first and second probes.

25. An audible voltage-impedance tester as defined in claim 23, wherein the case is substantially of a cylindrical cross-sectional shape with one of the two probes emanating from one of the end terminations of the case, and wherein the means for removably contacting across an unknown source includes a lead connected to the other probe.

* * * * *